(12) United States Patent
Dang et al.

(10) Patent No.: US 11,233,208 B2
(45) Date of Patent: Jan. 25, 2022

(54) FLEXIBLE DISPLAY SCREEN WITH GROOVE TO ACCOMMODATE A CHIP

(71) Applicants: Kunshan New Flat Panel Display Technology Center Co., Ltd., Jiangsu (CN); KunShan Go-Visionox Opto-Electronics Co., Ltd, Jiangsu (CN)

(72) Inventors: Pengle Dang, Jiangsu (CN); Ji Cheng, Jiangsu (CN); Xiuyu Zhang, Jiangsu (CN); Meiling Gao, Jiangsu (CN)

(73) Assignees: Kunshan New Flat Panel Display Technology Center Co., Ltd., Jiangsu (CN); Kunshan Go-Visionox Opto-Electronics Co., Ltd., Jiangsu (CN)

( * ) Notice: Subject to any disclaimer, the term of this patent is extended or adjusted under 35 U.S.C. 154(b) by 0 days.

(21) Appl. No.: 16/323,433

(22) PCT Filed: Mar. 8, 2018

(86) PCT No.: PCT/CN2018/078365
§ 371 (c)(1),
(2) Date: Feb. 5, 2019

(87) PCT Pub. No.: WO2018/166390
PCT Pub. Date: Sep. 20, 2018

(65) Prior Publication Data
US 2019/0393433 A1 Dec. 26, 2019

(30) Foreign Application Priority Data

Mar. 14, 2017 (CN) .......................... 201710149699.1

(51) Int. Cl.
*H01L 51/00* (2006.01)
*H05K 7/20* (2006.01)
(Continued)

(52) U.S. Cl.
CPC .......... *H01L 51/0097* (2013.01); *H01L 25/18* (2013.01); *H01L 51/529* (2013.01);
(Continued)

(58) Field of Classification Search
CPC ........................ H01L 51/0097; H05K 7/20963
(Continued)

(56) References Cited

U.S. PATENT DOCUMENTS 4,172,005 A * 10/1979 Muraoka ........... H01L 21/76297
252/79.5
2009/0213292 A1 8/2009 Park et al.
(Continued)

FOREIGN PATENT DOCUMENTS

CN 202230276 U 5/2012
CN 104050884 A 9/2014
(Continued)

OTHER PUBLICATIONS

Extended Search Report issued in European Application No. 18766966. 8, dated Dec. 16, 2019.

*Primary Examiner* — Robert T Huber
(74) *Attorney, Agent, or Firm* — BakerHostetler

(57) ABSTRACT

A flexible display screen and a flexible display apparatus are provided. The flexible display screen includes a display device, a flexible substrate, a support structure and a drive chip. The display device is positioned on the flexible substrate, and the flexible substrate is positioned on the support structure. The support structure further defines a groove thereon to accommodate the drive chip.

13 Claims, 3 Drawing Sheets

(51) Int. Cl.
*H01L 25/18* (2006.01)
*H01L 51/52* (2006.01)

(52) U.S. Cl.
CPC ..... *H01L 51/5253* (2013.01); *H05K 7/20963* (2013.01); *H01L 2251/5338* (2013.01)

(58) Field of Classification Search
USPC ...................................... 257/40, 88, E51.022
See application file for complete search history.

(56) References Cited

U.S. PATENT DOCUMENTS

| | | |
|---|---|---|
| 2011/0037059 A1 | 2/2011 | Gyoda |
| 2014/0217382 A1 | 8/2014 | Kwon et al. |
| 2014/0307396 A1 | 10/2014 | Lee |
| 2015/0021570 A1 | 1/2015 | Kim et al. |

FOREIGN PATENT DOCUMENTS

| | | |
|---|---|---|
| CN | 104300089 A | 1/2015 |
| CN | 204144262 U | 2/2015 |
| CN | 204189792 U | 3/2015 |
| CN | 204464289 U | 7/2015 |
| CN | 105009188 A | 10/2015 |
| CN | 204884440 U | 12/2015 |
| CN | 205303466 U | 6/2016 |
| CN | 106157821 A | 11/2016 |
| CN | 106356472 A | 1/2017 |
| EP | 2778773 A1 | 9/2014 |
| EP | 2827372 A2 | 1/2015 |
| JP | 6413523 A | 1/1989 |
| JP | 2011040269 A | 2/2011 |
| JP | 2013156624 A | 8/2013 |
| KR | 1020170015021 A | 2/2017 |
| KR | 101985223 B1 | 6/2019 |
| WO | 2014119972 A1 | 8/2014 |

\* cited by examiner

FLEXIBLE DISPLAY SCREEN WITH GROOVE TO ACCOMMODATE A CHIP

CROSS-REFERENCE TO RELATED APPLICATIONS

This application is a National Stage of International patent application PCT/CN2018/078365, filed on Mar. 8, 2018, which claims priority to foreign Chinese patent application No. CN 201611071901.5, filed on Mar. 14, 2017, the disclosures of which are incorporated by reference in their entirety.

TECHNICAL FIELD

The disclosure relates to the field of flexible display, and more particularly to a flexible display screen and a flexible display apparatus.

BACKGROUND

The flexible display screen is a display screen using a flexible material as a substrate. Compared with the conventional display screen using glass as the substrate, the flexible display screen is widely used in the various display fields for its characteristics such as light and thin, bendable, and impact resistant. In recent years, with the continuous development of flexible display technology, the flexible display screen has become one of the developing directions of the future display field.

Generally, as for a flexible display screen in which an ineffective display area is bent, as shown in FIG. 1, the flexible display screen may comprise a display device 11, a flexible substrate 12, a support structure 13, and a drive chip 14.

However, in practical applications, due to having a certain thickness, the drive chip 14 causes the flexible substrate 12 above it to bend so that the entire screen body is bent, thereby further affecting the display effect of the flexible display screen.

SUMMARY

The main object of the disclosure is to provide a flexible display screen and a flexible display apparatus, which aim to solve the problem in the prior art that the drive chip causes the screen body to bend due to having a certain thickness, thereby further affecting the display effect of the flexible display screen.

In order to achieve the above object, a flexible display screen proposed by the disclosure comprises a display device, a flexible substrate, the display device being positioned on the flexible substrate, a drive chip, and a support structure, the flexible substrate being positioned on the support structure, the support structure defining a groove accommodating the drive chip.

Optionally, a thickness of the support structure is equal to or larger than a thickness of the drive chip.

Optionally, a shape and a position of the groove match a shape and a position of the drive chip.

Optionally, the support structure comprises a support film.

Optionally, the support structure comprises a support film and a cushioning member, the support film is positioned on the cushioning member and the flexible substrate is positioned on the support film.

Optionally, the support structure comprises a support film and a heat-dissipating member, the support film is positioned on the heat-dissipating member and the flexible substrate is positioned on the support film.

Optionally, the support structure comprises a support film, a cushioning member and a heat-dissipating member, the support film is positioned on the cushioning member, the cushioning member is positioned on the heat-dissipating member and the flexible substrate is positioned on the support film.

Optionally, the display device in the flexible display screen is an OLED.

Optionally, the flexible display screen further comprises a first film, a second film and a connecting member, wherein the first film is positioned on the display device, the connecting member is positioned on the first film and the second film is positioned on the connecting member.

In addition, in order to achieve the above object, the disclosure provides a flexible display apparatus comprising the above flexible display screen.

In the technical solution of the disclosure, the flexible display screen comprises a display device, a flexible substrate, a support structure and a drive chip, the display device is positioned on the flexible substrate, and the flexible substrate is positioned on the support structure, wherein the support structure is provided with a groove which is used to the drive chip. Thus, in the embodiments of the disclosure, since the groove for receiving the drive chip is disposed in the support structure of the flexible display screen in comparison with the prior art, the drive chip does not bend the screen body of the flexible display screen, thereby further not affecting the display effect of the flexible display screen.

BRIEF DESCRIPTION OF THE DRAWINGS

In order to clearly illustrate embodiments of the disclosure and technical solutions in the prior art, the drawings required for describing the embodiments or the prior art will be simply introduced below. It is apparent that the drawings in the following description are merely some embodiments of the disclosure. Based on structures shown in these drawings, other drawings can be obtained by a person skilled in the art without paying creative work.

Figure 1:
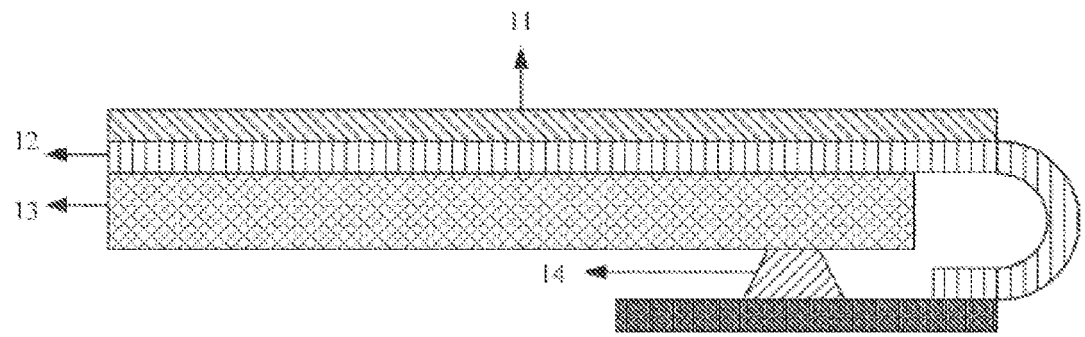
FIG. 1 is a structural schematic view of a flexible display screen in the prior art.

The implementation, functional features and advantages of the disclosure will be further described in combination with the embodiments with reference to the accompanying drawings.

DETAILED DESCRIPTION

Technical solutions in the embodiments of the disclosure will be described below clearly and completely with reference to the drawings in the embodiments of the disclosure.

It is apparent that the described embodiments are merely part of the embodiments of the disclosure rather than all the embodiments. Based on the embodiments in the disclosure, all the other embodiments obtained by a person skilled in the art without paying creative work will fall into the protection scope of the disclosure.

It should be noted that all directional indications (such as up, down, left, right, front, back . . . ) in the embodiments of the disclosure are only used to explain relative position relationship and motion state and the like among components at a specific posture (as shown in the drawings), and if the specific posture changes, the directional indication also changes accordingly.

In addition, the descriptions of "first", "second", and the like in the disclosure are only used for descriptive purposes, and should not be construed as indicating or implying their relative importance or implicitly indicating the number of technical features indicated. Thus, features defined with "first" or "second" may comprise at least one of the features, either explicitly or implicitly. In the description of the disclosure, the meaning of "a plurality of" is at least two, such as two, three, etc., unless otherwise expressly and specifically defined.

In the disclosure, the terms "connected", "fixed" and the like should be understood broadly, unless otherwise explicitly specified and defined. For example, "fixed" may be a fixed connection, or may be a detachable connection, or may be integrated; may be mechanically connected or electrically connected; may be directly connected, or may be indirectly connected through an intermediate medium; may be internal communication of two elements or an interaction relationship of two elements, unless otherwise explicitly defined. A person skilled in the art may understand the specific meanings of the above terms in the disclosure according to specific conditions.

In addition, technical solutions between the various embodiments of the disclosure may be combined with each other, but must ensure that a person skilled in the art can achieve such combination, and the combination of the technical solutions should be considered to be nonexistent and not to be covered by the scope of protection of the disclosure when the combination of the technical solutions is contradictory or impossible to implement.

The flexible display screen in the embodiments of the disclosure refers to a display screen in which an ineffective display area is bent. As for the flexible display screen in which an ineffective display area is bent, the technical solutions provided by the embodiments of the disclosure may ensure that the drive chip in the flexible display screen would not cause screen body to bend and then the display effect of the flexible display screen would not be affected.

It should be noted that, in the prior art, in order to cause the drive chip not bend the screen body, thereby affecting the display effect of the display screen, a support block and a double-sided tape are usually bound on the outside of the support structure, which may avoid the drive chip from protruding against the screen body and allows the screen body not to bend or affect the display effect of the flexible display screen. However, binding the support block and double-sided tape makes the manufacturing process of the flexible display screen more complicated and the manufacturing cost higher, and considering the expansion rate of materials, the expansion ratio of the selected materials for the support block and double-sided tape is required to be suitable for the support structure so that it is hard to select materials. Once there is a problem of the material selection, the corresponding effect will not be achieved.

By providing a groove for receiving the drive chip in the support structure of the flexible display screen, the flexible display screen provided by the embodiments of the disclosure may not only cause the screen body not to bend, thereby not affecting the display effect, but also reduce the manufacturing cost and simplify the manufacturing process and avoid the problem of difficult material selection.

It should also be noted that since the support structure in the flexible display screen in the embodiments of the disclosure does not affect the display effect of the flexible display screen, the support structure would not affect the display effect of the flexible display screen after a groove is disposed in the support structure in the flexible display screen.

The technical solutions provided by the embodiments of the disclosure are described below in detail with reference to the accompanying drawings.

Figure 2:
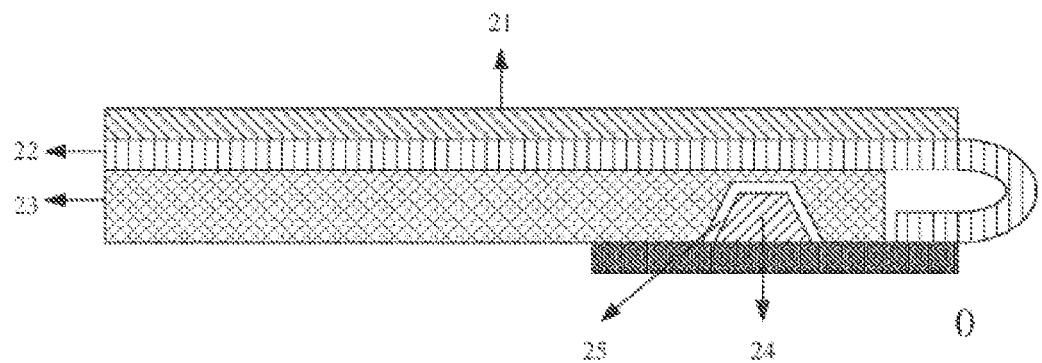
FIG. 2 is a structural schematic view of a flexible display screen provided by an embodiment of the disclosure.

FIG. 2 is a structural schematic view of a flexible display screen provided by an embodiment of the disclosure. The flexible display screen is described as follows.

As shown in FIG. 2, the flexible display screen includes a display device 21, a flexible substrate 22, a support structure 23, and a drive chip 24, wherein the display device 21 is positioned on the flexible substrate 22 and the flexible substrate 22 is positioned on the support structure 23. That is to say, the display device 21, the flexible substrate 22, and the support structure 23 included in the flexible display screen provided by the embodiment of the disclosure are sequentially connected from top to bottom in the order of the display device 21, the flexible substrate 22, and the support structure 23. The drive chip 24 may be positioned on a flexible circuit board.

In the embodiment of the disclosure, a groove 25 is disposed in the support structure 23 and may be used to receive the drive chip 24 in the flexible display screen. As shown in FIG. 2, the drive chip 24 is positioned within the groove 25. Thus, the drive chip 24 does not protrude against the upper flexible substrate 22 in comparison with the prior art so that the screen body of the flexible display screen is not bent, and thus does not affect display effect of the flexible display screen.

It should be noted that, in the embodiment of the disclosure, it is necessary to make the thickness of the support structure 23 be greater than or equal to the thickness of the drive chip 24 so that the groove 25 disposed in the support structure 23 may receive the drive chip 24.

In practical applications, if the thickness of the support structure 23 in the flexible display screen is smaller than the thickness of the drive chip 24, the thickness of the support structure 23 may be increased when designing the support structure 23, so that the groove 25 disposed in the support structure 23 may receive the drive chip 24.

In the embodiment of the disclosure, the shape and position of the groove 25 may be determined according to the shape and position of the drive chip 24 when disposing the groove 25 in the support structure 23. As shown in FIG. 2, the drive chip 24 has a trapezoidal cross section, so the cross section of the groove 25 may also be trapezoidal and the height of the trapezoid may be determined according to the thickness of the drive chip 24, so as to receive the drive chip 24. For example, if the drive chip 24 has a thickness of 0.2 mm, the groove 25 having a height of greater than 0.2 mm is required to receive the drive chip 24.

Figure 3:
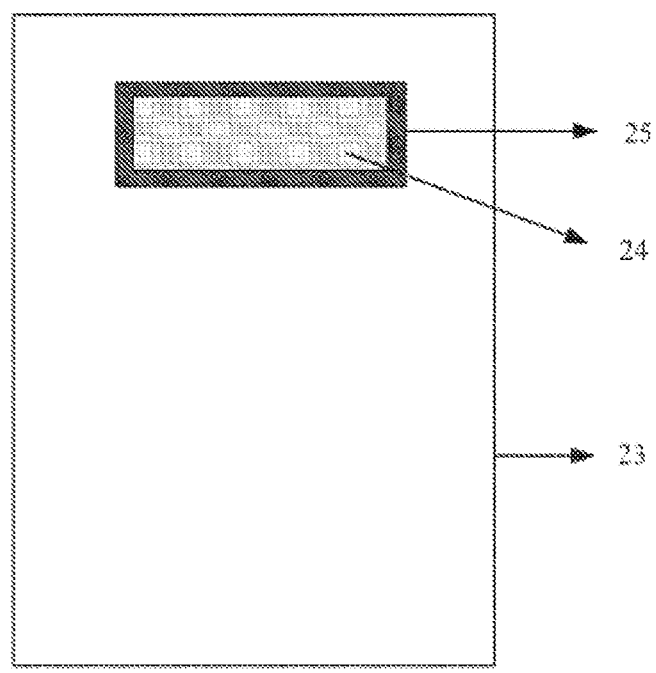
FIG. 3 is a top view of a groove provided by an embodiment of the disclosure.

As shown in FIG. 3, it is a top view of the groove 25. In FIG. 3, viewed from the top view, the drive chip 24 has a shape of rectangle, so the groove 25 has also a shape of rectangle from the top view, and the rectangular length from the top view of the groove 25 may be determined according to the rectangular length from the top view of the drive chip 24, and the width may be determined according to the rectangular width from the top view of the drive chip 24, so that the groove 25 can receive the drive chip 24.

For example, the drive chip 24 has a shape of rectangle from the top view, and the length of the rectangle is 0.3 mm and the width is 0.2 mm, so the rectangular length from the top view of the groove 25 is required to be greater than 0.3 mm, and the width is required to be greater than 0.2 mm.

In the embodiment of the disclosure, the support structure 23 may serve to support the flexible substrate 22, and the support structure 23 can be a support film.

The display device 21 may be an OLED, or may be an LED, and may also be other display devices, which is not specifically defined herein. As a preferred manner, the display device 21 is an OLED. The material for the flexible substrate 22 may be a PI (its English full name: Polyimide) material.

The flexible display screen provided by the embodiment of the disclosure includes a display device, a flexible substrate, a support structure and a drive chip, and the display device is positioned on the flexible substrate and the flexible substrate is positioned on the support structure, wherein the support structure is provided with a groove for receiving the drive chip. Thus, in the embodiment of the disclosure, since the groove for receiving the drive chip has been disposed in the support structure of the flexible display screen in comparison with the prior art, the drive chip would not bend the screen body of the flexible display screen, thereby not affecting the display effect of the flexible display screen.

Figure 4:
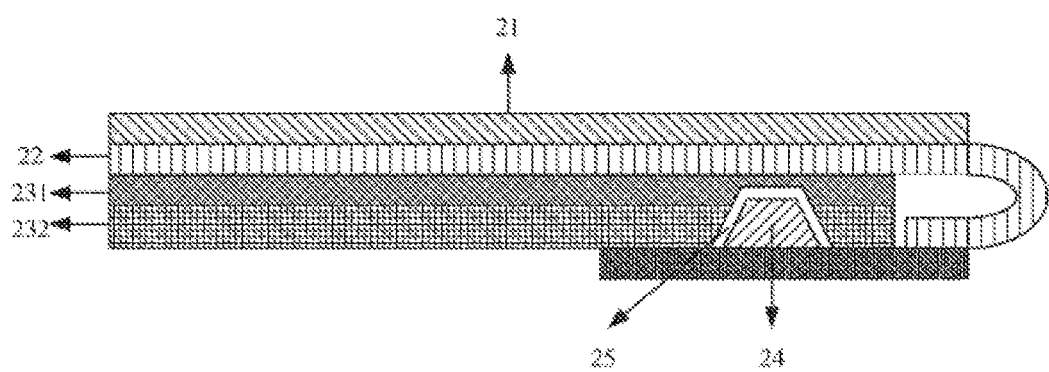
FIG. 4 is a structural schematic view of another flexible display screen provided by an embodiment of the disclosure.

FIG. 4 is a structural schematic view of another flexible display screen provided by an embodiment of the disclosure. The flexible display screen is described as follows.

As shown in FIG. 4, the flexible display screen includes the display device 21, the flexible substrate 22, a support film 231, a cushioning member 232, and the drive chip 24. The display device 21, the flexible substrate 22, the support film 231 and the cushioning member 232 are sequentially connected from top to bottom in the order of the display device 21, the flexible substrate 22, the support film 231, and the cushioning member 232.

It should be noted that the support film 231 and the cushioning member 232 jointly constitute the support member 23 described in the embodiment 1, and the total thicknesses of the support film 231 and the cushioning member 232 is greater than or equal to the thickness of the drive chip 24. Wherein, the cushioning member 232 serves to cushion the flexible display screen, and the cushioning member 232 may be a foam.

In the embodiment of the disclosure, the groove 25 may be disposed in the cushioning member 232. Alternatively, the groove 25 may also be disposed in the support film 231 and the cushioning member 232. The groove 25 is used to receive the drive chip 24 in the flexible display screen.

Specifically, if the thickness of the cushioning member 232 is greater than the thickness of the drive chip 24, the groove 25 may be disposed in the cushioning member 232, or alternatively may be disposed in the support film 231 and the cushioning member 232; if the thickness of the cushioning member 232 is smaller than the thickness of the drive chip 24 and the thickness of the support film 231 and the cushioning member 232 is greater than the thickness of the drive chip 24, then, the groove 25 may be disposed in the support film 231 and the cushioning member 232.

For example, if the drive chip 24 has a thickness of 0.25 mm, the cushioning member 232 has a thickness of 0.30 mm and the support film 231 has a thickness of 0.15 mm, the groove 25 having a thickness of 0.28 mm may be disposed only in the cushioning member 232, and the groove 25 having a thickness of 0.40 mm may be disposed in the cushioning member 232 and the support film 231 to receive the drive chip 24; if the drive chip 24 has a thickness of 0.25 mm, the cushioning member 232 has a thickness of 0.10 mm and the support film 231 has a thickness of 0.20 mm, the groove 25 having a thickness of 0.28 mm may be disposed in the cushioning member 232 and the support film 231 to receive the drive chip 24.

As shown in FIG. 4, the drive chip 24 is positioned in the groove 25, and the groove 25 is disposed in the cushioning member 232 and the support film 231.

The flexible display screen provided by the embodiment of the disclosure includes a display device, a flexible substrate, a support film, a cushioning member, and a drive chip, and the display device is positioned on the flexible substrate and the flexible substrate is positioned on the support film, and the support film is positioned in the cushioning member, wherein a groove is disposed in the support film and/or the cushioning member and is used to receive the drive chip. Thus, in the embodiment of the disclosure, since the groove for receiving the drive chip has been disposed in the support film and/or the cushioning member of the flexible display screen in comparison with the prior art, the drive chip would not protrude against the flexible substrate, thereby not bending the screen body of the flexible display screen, and further not affecting the display effect of the flexible display screen.

Figure 5:
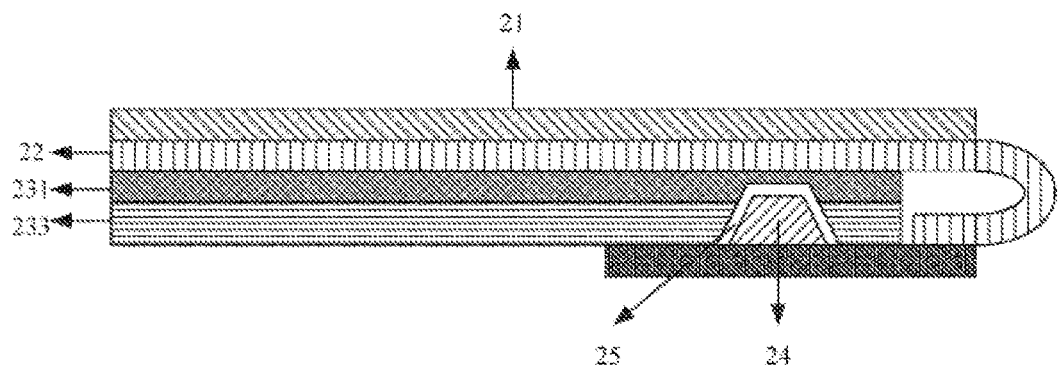
FIG. 5 is a structural schematic view of another flexible display screen provided by an embodiment of the disclosure.

FIG. 5 is a structural schematic view of another flexible display screen provided by an embodiment of the disclosure. The flexible display screen is described as follows.

As shown in FIG. 5, the flexible display screen includes the display device 21, the flexible substrate 22, the support film 231, a heat-dissipating member 233, and the drive chip 24. The display device 21, the flexible substrate 22, the support film 231 and the heat-dissipating member 233 are sequentially connected from top to bottom in the order of the display device 21, the flexible substrate 22, the support film 231 and the heat-dissipating member 233.

It should be noted that the support film 231 and the heat-dissipating member 233 jointly constitute the support member 23 described in the embodiment 1, and the total thicknesses of the support film 231 and the heat-dissipating member 233 is greater than or equal to the thickness of the drive chip 24, wherein the heat-dissipating member 233 serves to dissipate heat from the flexible display screen, and the heat-dissipating member 233 may be a copper foil.

In the embodiment of the disclosure, the groove 25 may be disposed in the heat-dissipating member 233. Alternatively, the groove 25 may be disposed in the support film 231 and the heat-dissipating member 233. The groove 25 is used to receive the drive chip 24 in the flexible display screen.

Specifically, if the thickness of the heat-dissipating member 233 is greater than the thickness of the drive chip 24, the groove 25 may be disposed only in the heat-dissipating member 233, or alternatively the groove 25 may be disposed in the heat-dissipating member 233 and the support film 231; if the thickness of the heat-dissipating member 233 is smaller than the thickness of the drive chip 24 and the thickness of the heat-dissipating member 233 and the support film 231 is greater than the drive chip 24, the groove 25 may be disposed in the heat-dissipating member 233 and the support film 231.

For example, if the drive chip 24 has a thickness of 0.20 mm, the heat-dissipating member 233 has a thickness of 0.25 mm and the support film 231 has a thickness of 0.10 mm, the groove 25 having a thickness of 0.25 mm may be disposed only in the heat-dissipating member 233, or the groove 25 having a thickness of 0.30 mm may be disposed in the heat-dissipating member 233 and the support film 231 for receiving the drive chip 24; if the drive chip 24 has a thickness of 0.20 mm, the heat-dissipating member 233 has a thickness of 0.10 mm and the support film 231 has a thickness of 0.20 mm, the groove 25 having a thickness of 0.25 mm may be disposed in the heat-dissipating member 233 and the support film 231 for receiving the drive chip 24.

As shown in FIG. 5, the drive chip 24 is positioned within the groove 25, and the groove 25 is positioned in the heat-dissipating member 233 and the support film 231.

The flexible display screen provided by the embodiment of the disclosure includes a display device, a flexible substrate, a support film, a heat-dissipating member and a drive chip. The display device is positioned on the flexible substrate, the flexible substrate is positioned on the support film, and the support film is positioned on the heat-dissipating member, wherein a groove is disposed in the support film and/or the heat-dissipating member and serves to receive the drive chip. Thus, since the embodiment of the disclosure provides the groove for receiving the drive chip in the support film and/or the heat-dissipating member of the flexible display screen in comparison with the prior art, the drive chip does not protrude against the flexible substrate, thereby not bending the screen body of the flexible display screen and further not affecting the display effect of the flexible display screen.

Figure 6:
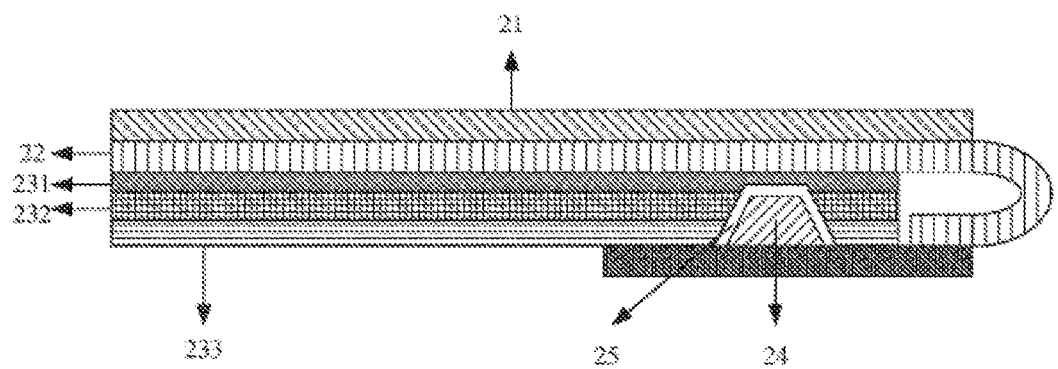
FIG. 6 is a structural schematic view of still another flexible display screen provided by an embodiment of the disclosure.

FIG. 6 is a structural schematic view of still another flexible display screen provided by an embodiment of the disclosure. The flexible display screen is described as follows.

As shown in FIG. 6, the flexible display screen includes the display device 21, the flexible substrate 22, the support film 231, the cushioning member 232, the heat-dissipating member 233, and the drive chip 24. The display device 21, the flexible substrate 22, the support film 231, the cushioning member 232, and the heat-dissipating member 233 are sequentially connected from top to bottom in the order of the display device 21, the flexible substrate 22, the support film 231, the cushioning member 232 and the heat-dissipating member 233.

It should be note that the support film 231, the cushioning member 232, and the heat-dissipating member 233 jointly constitute the support member 23 described in the embodiment 1. The total thickness of the support film 231, the cushioning member 232 and the heat-dissipating members 233 is greater than or equal to the thickness of the drive chip 24. The cushioning member 232 serves to cushion the flexible display screen, and the heat-dissipating component 233 serves to dissipate heat from the flexible display screen. The cushioning member 232 may be a foam. The heat-dissipating member 233 may be a copper foil.

In the embodiment of the disclosure, the groove 25 may be disposed in the heat-dissipating member 233. Alternatively, the groove 25 may be disposed in the heat-dissipating member 233 and the cushioning member 232. Alternatively, the groove 25 may be disposed in the heat-dissipating member 233, the cushioning member 232 and the support film 231. The groove 25 serves to receive the drive chip 24 in the flexible display screen.

Specifically, if the thickness of the heat-dissipating member 233 is greater than the thickness of the drive chip 24, the groove 25 may be disposed only in the heat-dissipating member 233, or the groove 25 may be disposed in the heat-dissipating member 233 and the cushioning member 232, or the groove 25 may be disposed in the heat-dissipating member 233, the cushioning member 232 and the support film 231; if the thickness of the heat-dissipating member 233 is smaller than the thickness of the drive chip 24 and the total thicknesses of the heat-dissipating member 233 and the cushioning member 232 is greater than the thickness of the drive chip 24, the groove 25 may be disposed in the heat-dissipating member 233 and the cushioning member 232, or the groove 25 may be disposed in the heat-dissipating member 233, the cushioning member 232 and the support film 231; if the total thicknesses of the heat-dissipating member 233 and the cushioning member 232 is smaller than the thickness of the drive chip 24 and the total thicknesses of the heat-dissipating member 233, the cushioning member 232 and the support film 231 is greater than the thickness of the drive chip 24, the groove 25 may be disposed in the heat-dissipating member 233, the cushioning member 232 and the support film 231.

For example, if the drive chip 24 has a thickness of 0.25 mm, the support film 231 has a thickness of 0.15 mm, the cushioning member 232 has a thickness of 0.1 mm, and the heat-dissipating member 233 has a thickness of 0.1 mm, the groove 25 may be disposed in the heat-dissipating member 233, the cushioning member 232 and the support film 231 and the disposed groove 25 can have a thickness of 0.28 mm.

As shown in FIG. 6, the drive chip 24 is positioned in the groove 25, and the groove 25 is disposed in the support film 231, the cushioning member 232 and the heat-dissipating member 233.

The flexible display screen provided by the embodiment of the disclosure includes a display device, a flexible substrate, a support film, a cushioning member, a heat-dissipating member and a drive chip. The display device is positioned on the flexible substrate, the flexible substrate is positioned on the support film, the support film is positioned on the cushioning member and the cushioning member is positioned on the heat-dissipating member, wherein a groove is disposed in the support film, the cushioning member and/or the heat-dissipating member for receiving the drive chip. Thus, in the embodiment of the disclosure, since the groove for receiving the drive chip has been disposed in the support film, the cushioning member and the heat-dissipating member of the flexible display screen in comparison with the prior art, the drive chip does not protrude against the flexible substrate, thereby not bending the screen body of the flexible display screen, and further not affecting the display effect of the flexible display screen.

Figure 7:
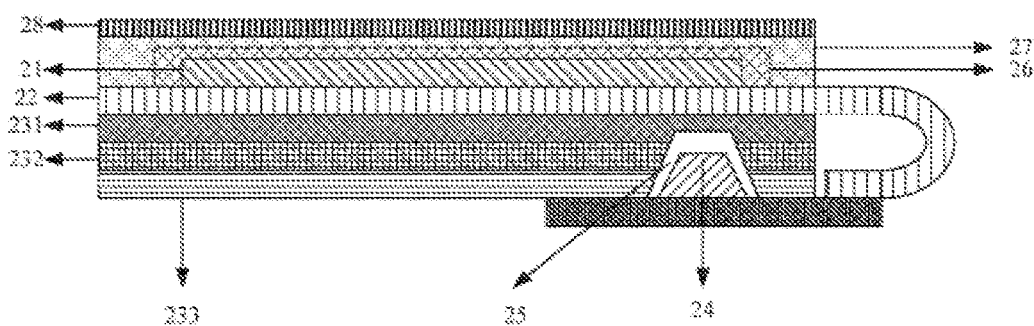
FIG. 7 is a structural schematic view of still another flexible display screen provided by an embodiment of the disclosure.

FIG. 7 is a structural schematic view of still another flexible display screen provided by an embodiment of the disclosure. The flexible display screen is described as follows.

It should be noted that the flexible display screen shown in FIG. 7 is different from the flexible display screen shown in FIG. 6 in that a first film 26, a connecting member 27, and a second film 28 are sequentially added on the display device 21 of the flexible display screen in FIG. 7.

In FIG. 7, the first film 26 provides a first layer of protection for the display device 21, and the second film 28 provides a second layer of protection for the display device 21, and the connecting member 27 serves to connect the first film 26 with the second film 28 and may be a gel-like material.

The flexible display screen provided by the embodiment of the disclosure includes a second film, a connecting member, a first film, a display device, a flexible substrate, a support film, a cushioning member and a heat-dissipating member which are sequentially connected one another, wherein a groove is disposed in the support film, the cushioning member, and the heat-dissipating member for receiving a drive chip. Thus, the drive chip does not protrude against the flexible substrate, and correspondingly the screen body of the flexible display screen would not bend, thereby not affecting the display effect of the flexible display screen.

It should be noted that, as for the flexible display screen according to any one of embodiments 1 to 5 described above, since the drive chip is received in the support structure, the thickness of the entire flexible display screen may be reduced.

Embodiments of the disclosure further provide a flexible display apparatus comprising the above flexible display screen.

The above description is only preferable embodiments of the disclosure and is not intended to limit the patent scope of the disclosure. Within the ideas and concepts of the disclosure, any equivalent modifications made by using the contents from the description and drawings of the disclosure or used directly or indirectly in other related technical fields will be included in the patent scope of the disclosure.

What is claimed is:

1. A flexible display screen, comprising:
   a display device,
   a flexible substrate, the display device being positioned on the flexible substrate,
   a drive chip, and
   a support structure, the flexible substrate being positioned on the support structure, the support structure defining a groove accommodating the drive chip,
   wherein the support structure comprises a support film, a cushioning member, and a heat-dissipating member, the support film being positioned on the cushioning member, the cushioning member being positioned on the heat-dissipating member, and the flexible substrate being positioned on the support film,
   wherein the heat-dissipating member is a copper foil, and
   wherein the groove extends toward the display device across the heat-dissipating member and the cushioning member to be sequentially disposed in the support film.

2. The flexible display screen according to claim 1, wherein, a thickness of the support structure is equal to or larger than a thickness of the drive chip.

3. The flexible display screen according to claim 2, wherein, a shape and a position of the groove match a shape and a position of the drive chip.

4. The flexible display screen according to claim 1, wherein, the display device in the flexible display screen is an Organic Light Emitting Diode (OLED).

5. The flexible display screen according to claim 1, wherein, the drive chip is positioned on a flexible circuit board.

6. The flexible display screen according to claim 1, wherein a cross section of a portion of the groove within the heat-dissipating member is greater than a cross section of a portion of the groove within the cushioning member.

7. The flexible display screen according to claim 1, wherein a cross section of a portion of the groove within the cushioning member is greater than a cross section of a portion of the groove within the support film.

8. The flexible display screen according to claim 1, wherein a shape of the groove is trapezoidal.

9. A flexible display apparatus, comprising a flexible display screen which comprises:
   a display device,
   a flexible substrate, the display device being positioned on the flexible substrate,
   a drive chip, and
   a support structure, the flexible substrate being positioned on the support structure, the support structure defining a groove accommodating the drive chip,
   wherein the support structure comprises a support film, a cushioning member, and a heat-dissipating member, the support film being positioned on the cushioning member, the cushioning member being positioned on the heat-dissipating member, and the flexible substrate being positioned on the support film,
   wherein the heat-dissipating member is a copper foil, and
   wherein the groove extends toward the display device across the heat-dissipating member and the cushioning member to be sequentially disposed in the support film.

10. The flexible display apparatus according to claim 9, wherein, a thickness of the support structure is equal to or larger than a thickness of the drive chip.

11. The flexible display apparatus according to claim 10, wherein, a shape and a position of the groove match a shape and a position of the drive chip.

12. The flexible display apparatus according to claim 9, wherein, the display device in the flexible display screen is an OLED.

13. The flexible display apparatus according to claim 9, wherein, the drive chip is positioned on a flexible circuit board.

* * * * *